United States Patent
Familia

(10) Patent No.: US 12,308,844 B2
(45) Date of Patent: May 20, 2025

(54) ADAPTIVE CYCLIC DELAY LINE FOR FRACTIONAL-N PLL

(71) Applicant: Intel Corporation, Santa Clara, CA (US)

(72) Inventor: Noam Familia, Modiin (IL)

(73) Assignee: Intel Corporation, Santa Clara, CA (US)

( * ) Notice: Subject to any disclaimer, the term of this patent is extended or adjusted under 35 U.S.C. 154(b) by 646 days.

(21) Appl. No.: 17/532,119

(22) Filed: Nov. 22, 2021

(65) Prior Publication Data

US 2023/0163766 A1 May 25, 2023

(51) Int. Cl.
| | |
|---|---|
| *H03L 7/081* | (2006.01) |
| *H03L 7/093* | (2006.01) |
| *H03L 7/197* | (2006.01) |

(52) U.S. Cl.
CPC ............. *H03L 7/081* (2013.01); *H03L 7/093* (2013.01); *H03L 7/1976* (2013.01)

(58) Field of Classification Search
CPC ........ H03L 7/081; H03L 7/093; H03L 7/1976
See application file for complete search history.

(56) References Cited

U.S. PATENT DOCUMENTS

| | | | | | |
|---|---|---|---|---|---|
| 7,015,738 | B1 * | 3/2006 | Cao | ...................... | H03C 3/0933 331/10 |
| 9,264,052 | B1 * | 2/2016 | Kesselring | ............... | H03L 7/085 |
| 9,344,271 | B1 * | 5/2016 | Dusatko | .............. | H03M 7/3015 |
| 10,291,389 | B1 * | 5/2019 | Midha | ................... | H04L 5/0048 |
| 10,355,702 | B2 * | 7/2019 | Gao | ...................... | H03L 7/0891 |
| 10,594,329 | B1 * | 3/2020 | Elkholy | ............... | H03M 3/344 |
| 10,707,881 | B1 * | 7/2020 | Ba | ............................ | H03L 7/093 |
| 10,895,850 | B1 * | 1/2021 | Elkholy | ............... | G04F 10/005 |
| 11,038,521 | B1 * | 6/2021 | Rafi | ..................... | H03M 7/3024 |
| 11,387,833 | B1 * | 7/2022 | Li | ........................... | H03L 7/081 |
| 11,632,230 | B2 * | 4/2023 | Li | ........................... | H04L 7/033 327/147 |
| 11,909,405 | B1 * | 2/2024 | Grimaldi | ................. | H03L 7/085 |
| 12,063,044 | B2 * | 8/2024 | Lee | ....................... | H03L 7/0991 |
| 12,107,588 | B2 * | 10/2024 | Khoury | .................... | H03B 5/32 |

(Continued)

OTHER PUBLICATIONS

Analog Devices, MT-086 Tutorial, "Fundamentals of Phase Locked Loops (PLLs)," 2009, 10 pages.

(Continued)

*Primary Examiner* — Adam D Houston
(74) *Attorney, Agent, or Firm* — Schwabe, Williamson & Wyatt, P.C.

(57) ABSTRACT

Embodiments herein relate to a phase-locked loop (PLL) circuit which compensates for varying delays in a feedback clock signal which are caused by the use of fractional division. In one aspect, a delay circuit is used to provide progressively larger delays for the feedback clock signal within each division cycle, when the divider uses the smaller divisor, N. This compensates for the associated larger frequency and smaller clock cycle, compared to when the divisor is N+1. Additionally, the delays introduced by the delay circuit can be controlled by an adaptive gain circuit. The adaptive gain circuit samples a phase error of a phase detector of the PLL to determine whether to increase or decreases the gain, thereby increasing or decreasing, respectively, the delay.

21 Claims, 13 Drawing Sheets

(56) References Cited

U.S. PATENT DOCUMENTS

| | | | |
|---|---|---|---|
| 12,119,830 B2* | 10/2024 | Park | H03L 7/085 |
| 12,132,490 B2* | 10/2024 | Megawer | H03L 7/195 |
| 2005/0226357 A1* | 10/2005 | Yoshimura | H03L 7/113 |
| | | | 375/376 |
| 2006/0033582 A1* | 2/2006 | Staszewski | H03L 7/085 |
| | | | 331/16 |
| 2007/0109067 A1* | 5/2007 | O'Sullivan | H03C 3/0925 |
| | | | 332/127 |
| 2007/0188243 A1* | 8/2007 | Waheed | H03L 7/101 |
| | | | 331/16 |
| 2007/0188244 A1* | 8/2007 | Waheed | H03L 7/113 |
| | | | 331/16 |
| 2010/0123488 A1* | 5/2010 | Palmer | H03L 7/1976 |
| | | | 327/116 |
| 2013/0301754 A1* | 11/2013 | Staszewski | H04L 27/127 |
| | | | 375/302 |
| 2015/0145569 A1* | 5/2015 | Perrott | H03M 1/66 |
| | | | 327/156 |
| 2020/0192301 A1* | 6/2020 | Khoury | H03L 7/085 |
| 2020/0195261 A1* | 6/2020 | Khoury | H03L 7/099 |
| 2020/0195263 A1* | 6/2020 | Khoury | G06F 1/0321 |
| 2023/0163766 A1* | 5/2023 | Familia | H03L 7/093 |
| | | | 327/158 |

OTHER PUBLICATIONS

Curtis Barret, Texas Instruments, Technical Brief SWRA029, "Fractional/Integer-N PLL Basics," Aug. 1999, 55 pages.

* cited by examiner

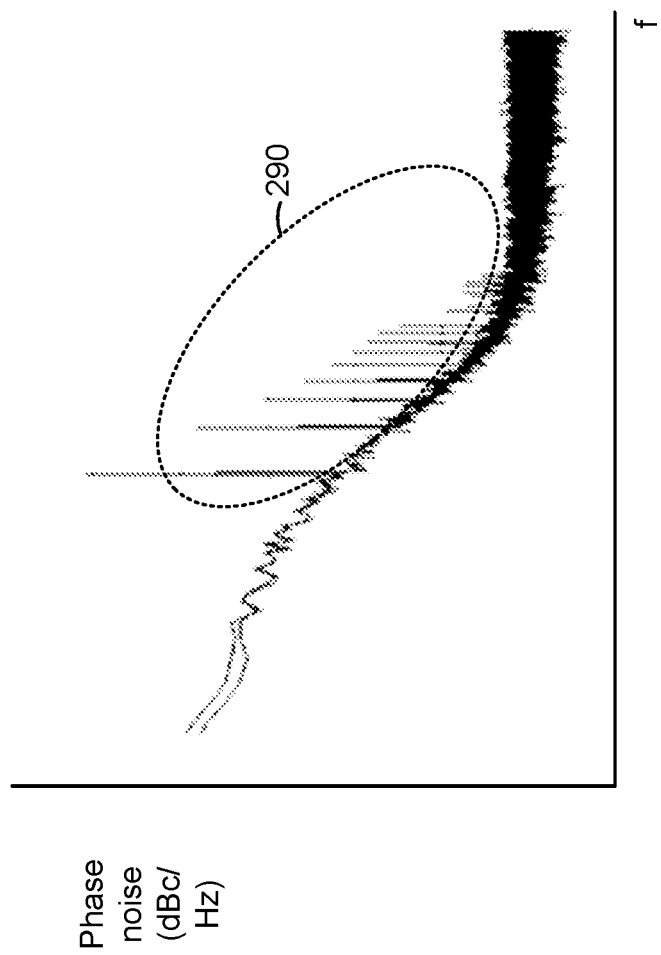

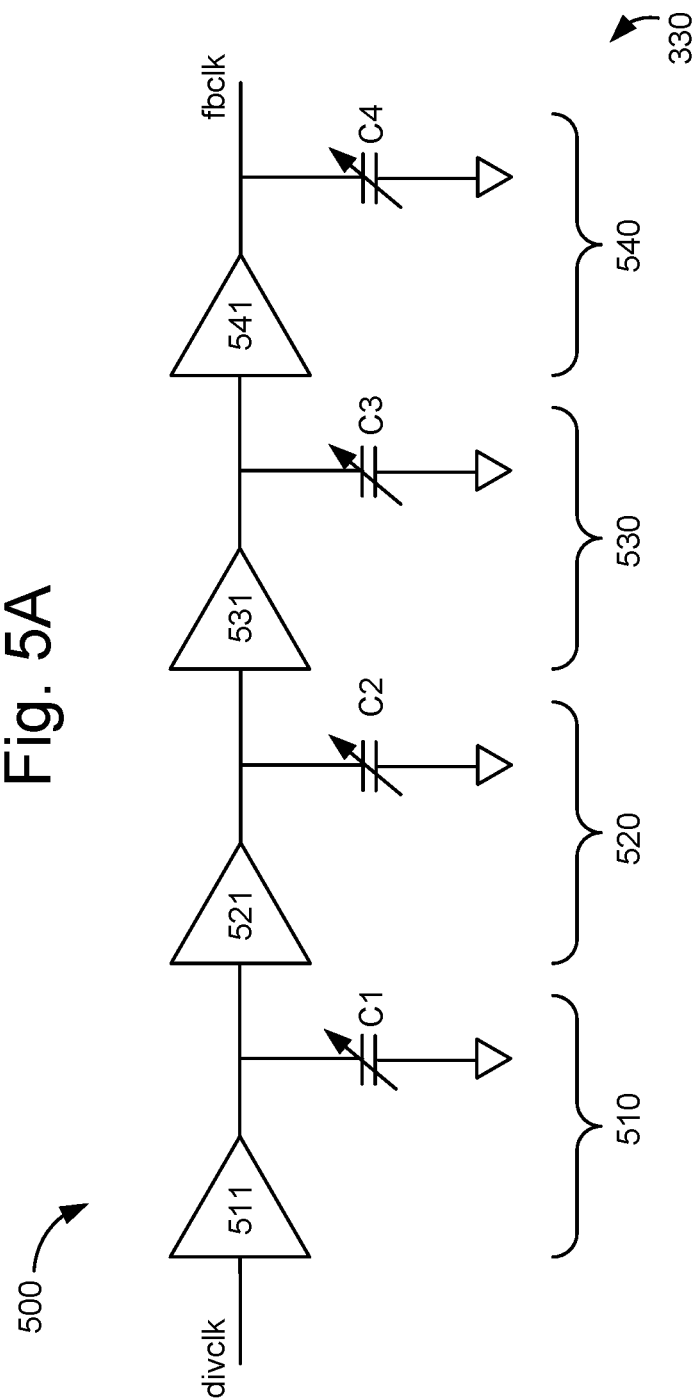
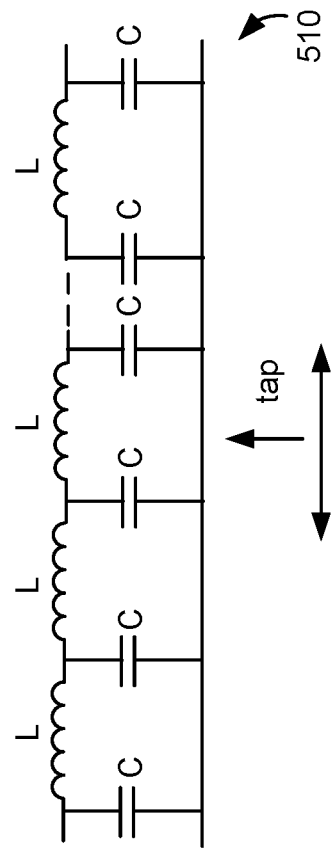
Fig. 5A
Fig. 5B

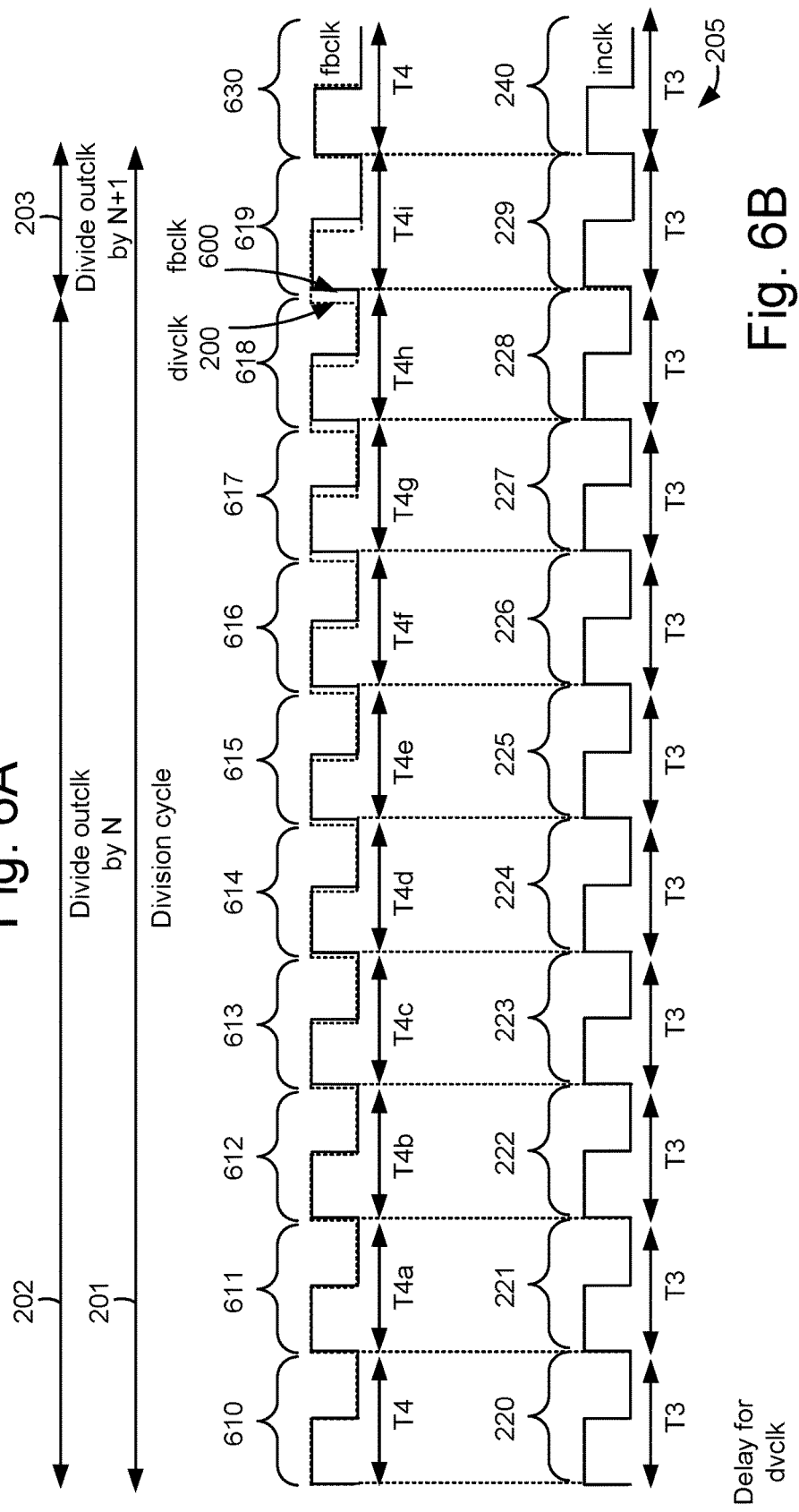
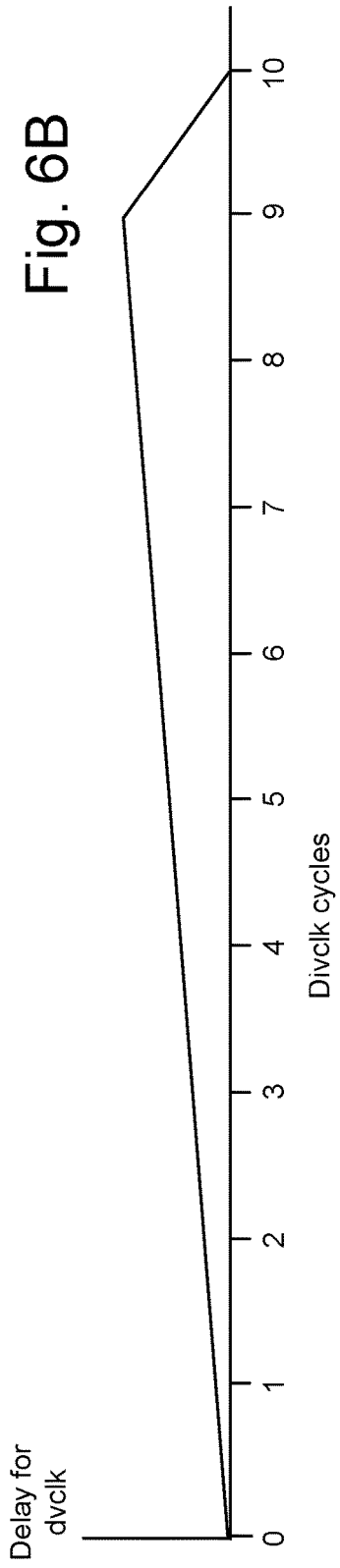
Fig. 6A
Fig. 6B

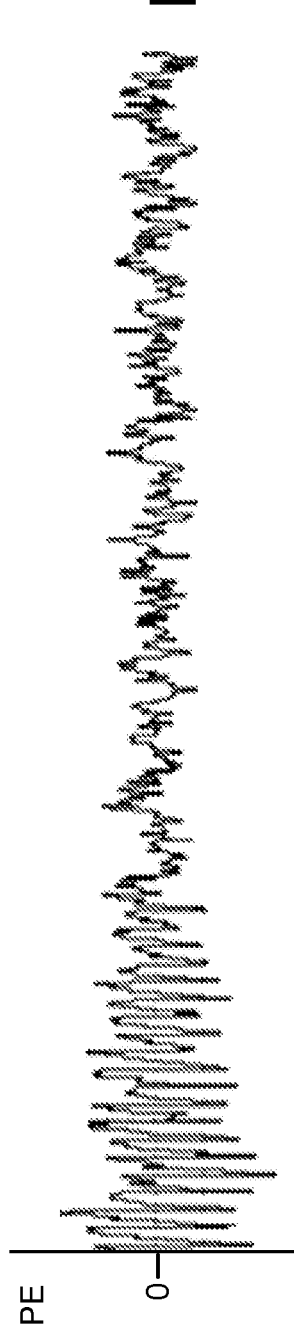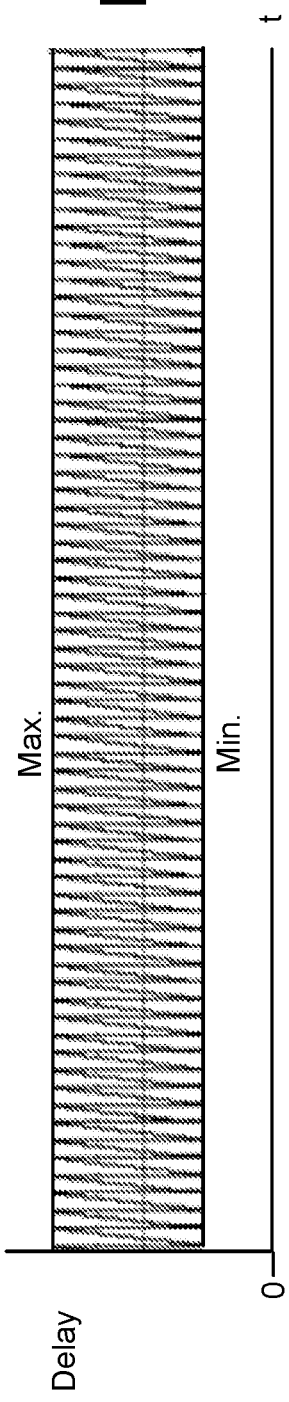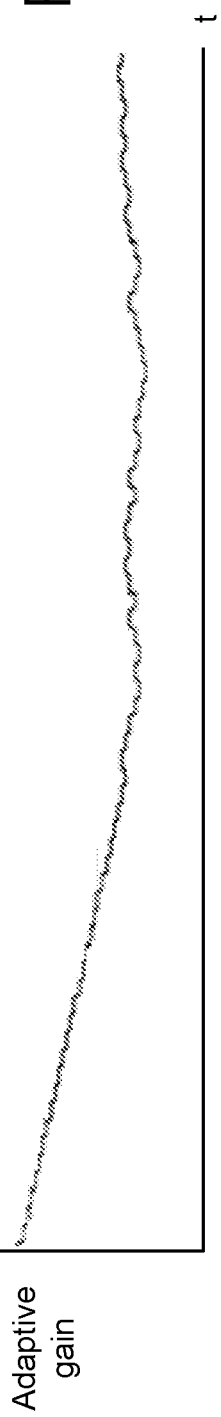

ADAPTIVE CYCLIC DELAY LINE FOR FRACTIONAL-N PLL

FIELD

The present application generally relates to the field of circuits, and more specifically, to a phase-locked loop.

BACKGROUND

A phase-locked loop (PLL) is a fundamental component of many circuits. A PLL receives an input clock signal and uses it to provide output a clock signal, typically at a higher frequency than the frequency of the input clock signal. Various applications of PLLs include demodulation of frequency-modulated (FM) and amplitude-modulated (AM) signals, use within a frequency synthesizer, signal recovery and in the distribution of precisely timed clock pulses in digital logic circuits and system, such as within a microprocessor system. However, various challenges are presented in providing a PLL.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2C depicts a plot of phase noise versus frequency for the PLL of FIG. 1, showing the presence of noise spurs.

FIG. 5A depicts an example implementation of the delay circuit 330 of FIG. 3.

FIG. 5B depicts an example implementation of the stage 510 of the delay circuit of FIG. 5A.

FIG. 6A depicts example signals for fbclk, divclk and inclk in the PLL of FIG. 3, showing a minimized phase difference between the signals fbclk and inclk within a division cycle, when the gain of the adaptive gain circuit 310 is optimal.

FIG. 6B depicts a delay of divclk versus divclk cycle number, showing a progressively increasing delay for successive clock cycles of divclk, consistent with FIG. 6A.

FIG. 13A depicts an example plot of phase error (PE) versus time in the PLL 300 of FIG. 3.

FIG. 13B depicts an example plot of the delay of divclk versus time in the PLL 300 of FIG. 3, consistent with FIG. 13A.

FIG. 13C depicts an example plot of the gain of the adaptive gain circuit of FIG. 3, consistent with FIGS. 13A and 13B.

DETAILED DESCRIPTION

Figure 1:
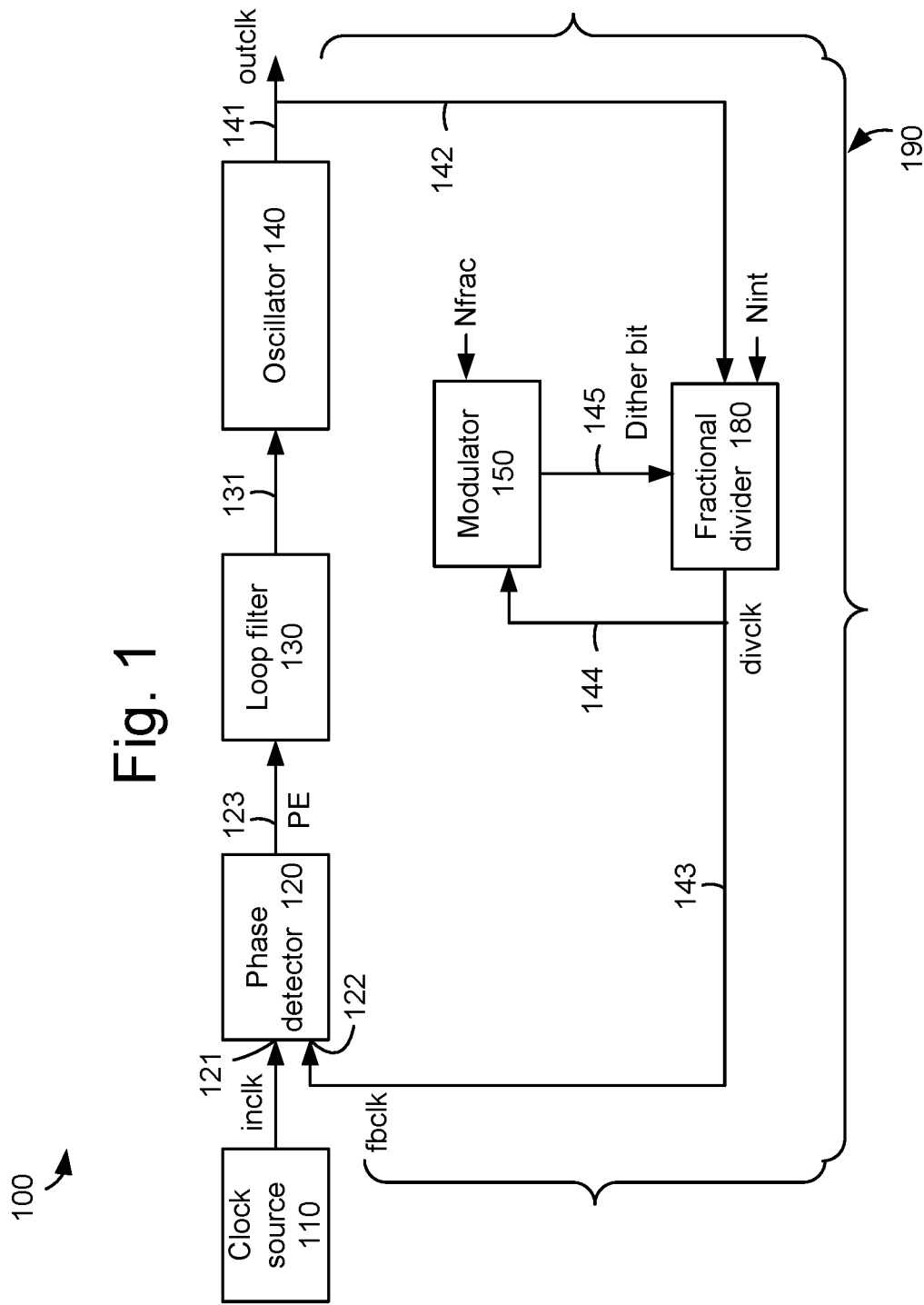
FIG. 1 illustrates an example phase-locked loop (PLL) 100.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

As mentioned at the outset, a PLL circuit, also referred to simply as a PLL, has many different applications. A PLL receives an input clock signal from a clock source such as a crystal oscillator. A crystal oscillator uses the mechanical resonance of a vibrating crystal of piezoelectric material to create a fixed frequency signal. A phase detector detects a phase error between the input clock signal and a feedback signal in the PLL to generate an error signal for a loop filter. Based on the code, the loop filter instructs an oscillator to adjust the frequency of the output clock of the PLL. Additionally, the output clock is divided down in frequency at a divider circuit to provide the feedback clock. This division allows the output clock to be at a higher frequency than the input clock.

The divider circuit can perform an integer or non-integer (fractional) division. For fractional division, the output clock signal is divided by one value, N, for some cycles, and by another value, N+1, for other cycles, for example. The pattern is repeated in successive division cycles of the divider circuit. However, the changing divisor makes it harder for the PLL to phase lock to the feedback signal which is output from the divider circuit. Additionally, there is a greater likelihood of jitter and noise spurs in the power spectrum of the feedback signal and therefore the output clock signal.

The techniques provided herein address the above and other issues by providing a PLL circuit which compensates for varying delays in the feedback clock signal which are caused by the use of fractional division. In one aspect, a delay circuit is used to provide progressively larger delays for the divided version of the output clock within each division cycle, when the divider uses the smaller divisor, N. This compensates for the associated larger frequency and smaller clock cycle, compared to when the divisor is N+1. Additionally, the delays introduced by the delay circuit can be controlled by an adaptive gain circuit. The adaptive gain circuit samples a phase error of a phase detector of the PLL to determine whether to increase or decreases the gain, thereby increasing or decreasing, respectively, the delay. The gain can be adjusted once per division cycle, for example. The PLL can therefore converge and remain at a stable, steady state condition.

The above and other advantages are discussed further below.

FIG. 1 illustrates an example phase-locked loop (PLL) 100. The PLL receives an input clock signal (inclk) from a clock source 110 such as a crystal oscillator. The input clock signal is received at a first input terminal 121 of a phase detector 120. A feedback clock signal (fbclk) is received at a second input terminal 122 of the phase detector. Based on a phase difference between the two input signals, the phase detector provides an output signal (phase error PE) on a path 123 for use by a loop filter 130. The loop filter provides a corresponding output signal on the path 131 to control the oscillator 140. The oscillator provides the clock signal, outclk, on the path 141. For example, the phase detector, loop filter and oscillator can be digitally-implemented, in which case the signals on the paths 123 and 131 are digital codes or code words.

In one possible implementation, a digital phase detector can comprise an exclusive-OR (XOR) logic gate. When the two signals being compared are completely in-phase, the XOR gate's output will have a constant level of zero. When the two signals differ in phase, the XOR gate's output will be high for a portion of each cycle which is proportional to the difference in phase. The output of the XOR gate thus changes duty cycle in proportion to the phase difference. The output can be applied to a low-pass filter to obtain an analog voltage that is proportional to the phase difference between the two signals. The phase difference can then be converted to a code word using an analog-to-digital converter. The input clock signals can be square waves.

In other possible implementations, a digital phase detector can be based on a sample and hold circuit, a charge pump, or a logic circuit comprising flip-flops. In another approach, the phase detector has an analog implementation.

The loop filter converts the signal representing the phase difference to a signal on path 131 for the oscillator 140. For example, in an all-digital implementation of the PLL, a digital loop filter can convert a code word representing the phase difference on the path 123 to a code word representing an output frequency, or a change in an output frequency, for the digitally-controlled oscillator on the path 131. The digital loop filter may be a proportional-integral filter which includes a proportional gain summed with an output of an integrator. The path 131 may be a digital bus, in this case, and the oscillator may be a synthesized digitally-controlled oscillator.

Alternatively, in a hybrid digital implementation, the path 131 may be coupled to a digital to analog converter (DAC) which, in turn is coupled to an analog oscillator. The DAC translates the code provided by the loop filter to an analog signal for controlling the oscillator.

In either case, the oscillator adjusts its output clock signal, outclk, based on the signal received from the filter, such that the loop filter controls the frequency and phase of the oscillator.

Outclk is also provided on a feedback path 190 of the PLL which is coupled to the second input terminal 122 of the phase detector. The feedback path includes a fractional divider 180. Outclk is provided to the fractional divider on a path 142. Outclk is divided in frequency by the fractional divider to provide the divided clock signal, divclk. Divclk=fbclk in this example. In one approach, the division is by an integer N for some cycles and by an integer N+1 for other cycles. For example, assume it is desired to provide outclk at a frequency (f)=10.01 GHz and that the frequency of inclk is 100 MHz. In this case, outclk can be divided by 100 for nine cycles of divclk and by 101 for one cycle of divclk. On average, outclk is divided by 100.1, where 10.01 GHz/100.1=100 Mhz. This process is repeated in consecutive divide cycles, where a divide cycle comprises ten cycles of divclk in this example. A divide cycle can comprise multiple divisions by N and one division by N+1, in one example. With the fractional division, the frequency of fbclk, on average, matches the frequency of inclk.

A modulator 150 is coupled to the fractional divider 180 to inform the divider of when to switch divisors using a dither bit on a path 145. The modulator may be a delta-sigma modulator, for example. The fractional divider can therefore switch between the divisors N and N+1 using the dither bit, in one approach. The modulator is also coupled to the path 143 to detect each cycle of divclk. The modulator can determine when a new division cycle starts by counting the cycles of divclk. When a division cycle starts, the dither bit is set to one value, e.g., 0, to indicate the divisor N is to be used by the divider. The dither bit is then maintained at 0 until the last cycle of divclk in the division cycle. The dither bit is then set to another value, e.g., 1, to indicate the divisor N+1 is to be used by the divider. The modulator receives the value Nfrac and the divider receives the value Nint from a control circuit. The overall frequency ratio from outclk to inclk is Nint+Nfrac, where Nint is the integer value and Nfrac is the fractional value. In the example discussed above, Nint=100 and Nfrac=0.1

The PLL can be integrated in a Very Large Scale Integration (VLSI) device as a circuit within a chip.

Figure 2A:
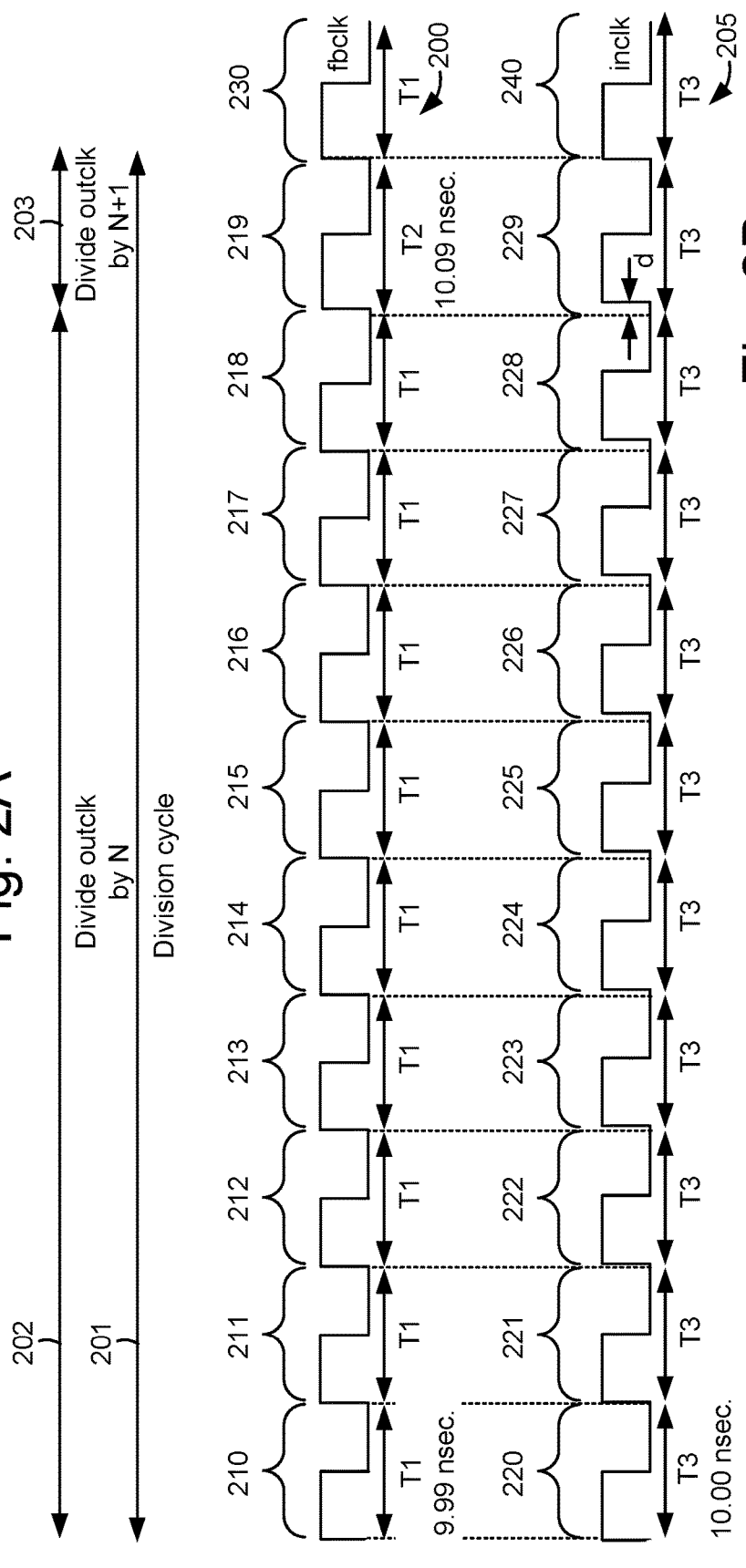
FIG. 2A depicts example signals for fbclk and inclk in the PLL of FIG. 1, showing an increasing phase difference between the signals within a division cycle.

FIG. 2A depicts example signals for fbclk and inclk in the PLL of FIG. 1, showing an increasing phase difference between the signals within a division cycle. The clock signal 200 is fbclk, which is equal to divclk in this example, and the clock signal 205 is inclk. The clock signals extend over one division cycle as depicted by the arrow 201. The division includes a time period (arrow 202) in which the divider divides outclk by N and a time period (arrow 203) in which the divider divides outclk by N+1. Fbclk includes nine cycles 210-218 which each have a period T1 and one cycle 219 which has a period T2. A cycle extends between rising edges of the clock signal in this example. An additional cycle 230 is a first fbclk cycle of a next division cycle.

For example, with the example of outclk=10.01 GHz, where N=100 and N=101, the frequency for cycles 210-218 is 10.01 GHz/100=100.1 MHz and the frequency for cycle 219 is 10.01 GHz/101=99.11 MHz. The period T1 is therefore 9.99 nsec. (nanoseconds) and T2=10.09 nsec.

Inclk includes ten cycles 220-229 in the division cycle which each have a same period of T3. An additional cycle 240 is a first inclk cycle of the next division cycle. In this example, the frequency of each cycle is 10.01 Ghz/100.1=100 MHz since 100.1 is the average or effective divisor. The period T3 is therefore 10.00 nsec. It can be seen that T2>T3>T1. Since T1<T3, the cycles of fbclk will be delayed by progressively larger amounts relative to inclk in the division cycle. Assuming the first cycle of fbclk is aligned with the first cycle of inclk, the delays increase progressively for cycles 211-219 relative to cycles 221-229, respectively. A maximum delay "d" is depicted for cycle 219 relative to cycle 229. The delays are indicated by gaps between the vertical dotted lines which align with a rise in fbclk, and a rise of a corresponding cycle of inclk. The delays indicate fbclk lags inclk. As mentioned, these delays can lead to noise and jitter in fbclk and then in outclk. The delay is reduced or removed altogether for the cycle 230 of fbclk relative to the cycle 240 of inclk due to the increase period T2 of the cycle 219.

Figure 2B:
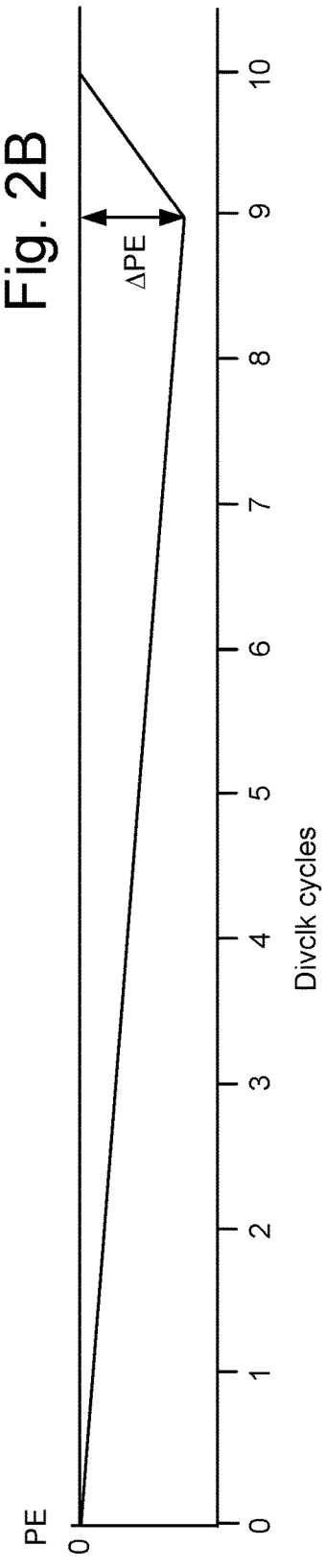
FIG. 2B depicts a phase error between divclk and inclk, consistent with FIG. 2A.

FIG. 2B depicts a phase error (PE) between fbclk and inclk, consistent with FIG. 2A. The vertical axis depicts the phase error and the horizontal axis depicts the clock cycle number for fbclk. The cycle number ranges from 1-10. The phase error is zero for cycle=1 since the cycles 210 and 220 are aligned. The phase error is negative for cycle=2 since the cycle 211 is behind the cycle 221. The phase error is further negative for cycle=3 since the cycle 212 is further behind the cycle 222, and so forth, such that the phase error is progressively greater in magnitude for each consecutive cycle starting with the second cycle of the division cycle. The largest magnitude phase error is seen with the last fbclk cycle 219 of the division cycle. The last fbclk cycle 219 is longer than the previous ones. This helps bring the rising edge of the fbclk cycle 230 in closer alignment with the rising edge of the last inclk cycle 240.

Generally, for the second through tenth cycles, fbclk lags relative to inclk. When the divider changes its divisor from N to N+1, in the tenth cycle, the phase of fbclk steps up by a whole outclk cycle time.

$\Delta PE$ represents a change in the PE at the tenth divclk cycle of the division cycle compared to the PE at the first cycle of the next division cycle. For example, $\Delta PE = \Delta PE$(1 st divclk cycle of division cycle n+1)−$\Delta PE$(last divclk cycle of division cycle n). The sign of $\Delta PE$ is positive in this example, since zero minus a negative number is positive, indicating fbclk lags relative to inclk. As discussed below, an adaptive gain circuit can be used to adjust the gain based on a difference in phase error for two samples of the phase error signal. This can be two consecutive samples such as depicted at time points 9 and 10, for example.

As discussed below, the techniques provided herein essentially cancel out large variations in the phase error, resulting in a steady phase error at or close to zero.

FIG. 2C depicts a plot of phase noise versus frequency (f) for the PLL of FIG. 1, showing the presence of noise spurs. The circled region 290 identifies undesired spurs or spikes in the phase noise which are caused by the use of a fractional divider. However, these spurs can be eliminated using the techniques discussed herein.

Figure 3:
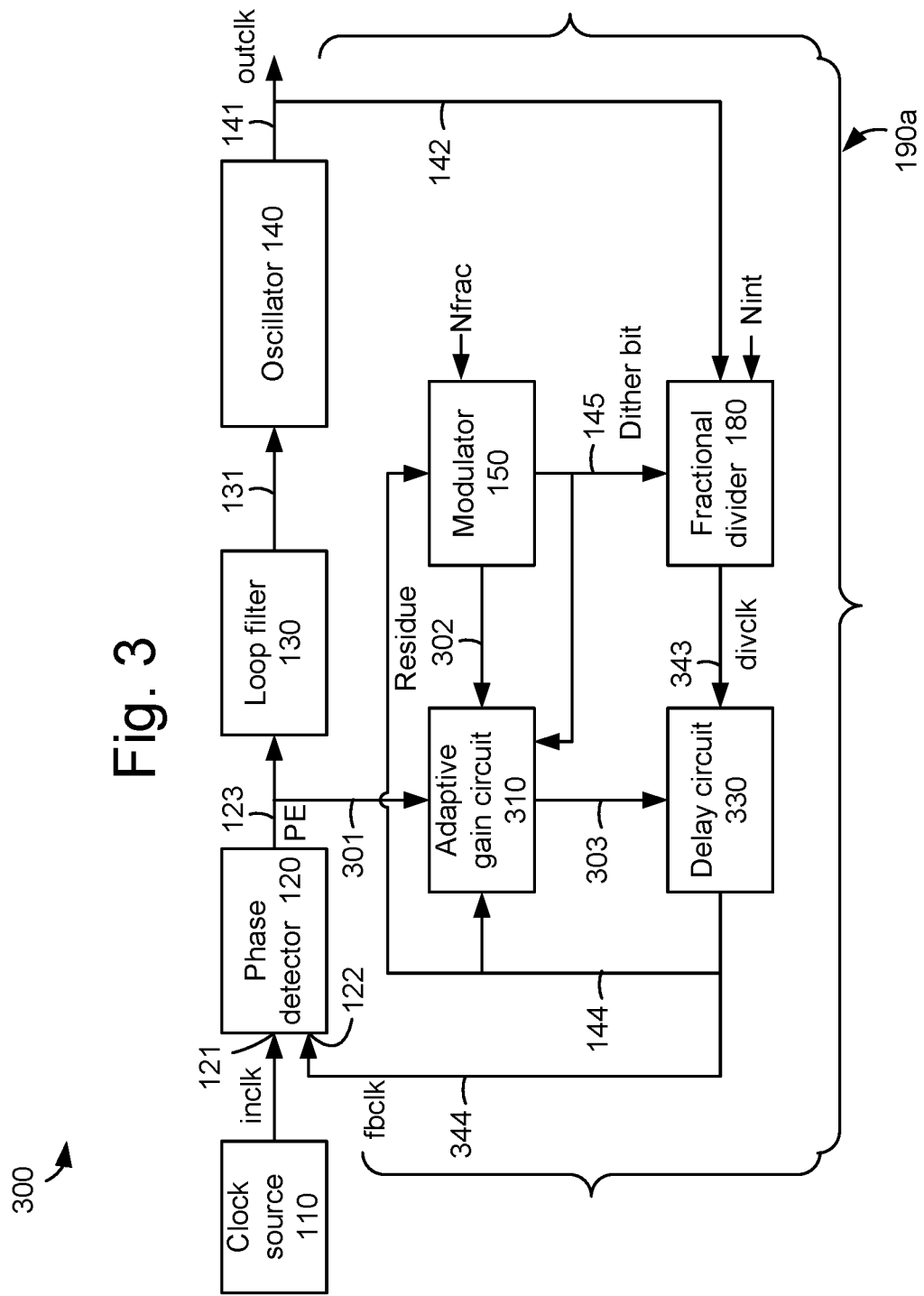
FIG. 3 illustrates an example PLL 300 which avoids the phase errors of FIG. 2B and the noise spurs of FIG. 2C.

FIG. 3 illustrates an example PLL 300 which avoids the phase errors of FIG. 2B and the noise spurs of FIG. 2C. The PLL includes the clock source 110, phase detector 120, loop filter 130, oscillator 140, modulator 150 and fractional divider 180 of FIG. 1, in one example. The PLL further includes a delay circuit 330 and an adaptive gain circuit 310. The delay circuit is coupled to the fractional divider to impose a delay on cycles of divclk according to a signal from the adaptive gain circuit on the path 303. The delayed version of divclk is output as fbclk. The adaptive gain circuit provides the signal based on phase error information obtained from the path 123 as well as from a residue or counter obtained from the modulator on a path 302. The adaptive gain circuit can use a constant gain throughout a division cycle, then adjust the gain for a next division cycle, in one approach. To do this, the adaptive gain circuit uses the phase error information to determine whether the gain should be increased, decreased or kept the same. The gain should be increased when fbclk lags inclk, decreased when fbclk leads inclk and kept the same when fbclk is in phase with inclk.

The fractional divider provides divclk on a path 343 to the delay circuit, and on the path 144 to the adaptive gain circuit as well as the modulator. The modulator circuit and the adaptive gain circuit are coupled to a portion (path 344) of the feedback path which carries fbclk. The adaptive gain circuit detects each new cycle in fbclk and changes the signal it provides to the delay circuit accordingly, so that the delay is progressively greater for consecutive cycles of fbclk in each division cycle. The adaptive gain circuit may also receive the dither bit to know when to reset the gain for the last divclk cycle of the division cycle. The delay may increase for each divclk cycle when the divisor is N and be reset for the divclk cycle in which the divisor is switched to N+1. In one approach, the adaptive gain circuit provides the product of the gain and the residue to the delay circuit for each cycle of divclk, starting with the second divclk cycle of a division cycle and ending with the last divclk cycle of the division cycle. The delay is then set based on this product.

A feedback path 190a of the PLL includes the path 142, the fractional divider 180, the path 343, the delay circuit 330 and the path 344.

The techniques described herein solve the problem of how to run a digital PLL in fractional-N mode, while avoiding jitter which is associated with the non-linearity of a time to digital converter (TDC). The techniques can be implemented efficiency compared to other approaches. For example, the techniques are less costly than approaches which attempt to cancel out the jitter in fbclk using a logic-based integral non-linearity (INL) cancellation. Moreover, the techniques are less complex than approaches which provide a phase interpolator design with very low INL, such as by providing a phase interpolator in the feedback path. Another option is to run the PLL at a very low bandwidth to filter out INL effects. However, this approach may not filter out very low frequency spurs. In addition, magnetic coupling may be problematic.

The techniques described herein use a delay line on the feedback path and control its delay to achieve a clean feedback clock without instantaneous phase errors. A simple and robust capacitor bank-based delay line is highly linear so there is no need for complicated logic to compensate for INL. The rate at which the delay ramps is set by a gain factor. Whenever the code that controls the delay line wraps-around (and the divider circuit modulates to N+1), the logic monitors the change in the phase detector output (whether it is positive or negative) and advances the gain towards the optimal value. This adaptation loop runs continuously to track changes such as temperature drifts.

A delay line with capacitor bank control has a very low INL and can be tuned to have a fine step size, e.g., less than 0.5 ps. The delay line itself is compact and modular. The logic to control the delay line can leverage the capabilities of other components in the PLL such as the sigma-delta modulator of the feedback divider. The techniques provide a compact narrow-range TDC with super-fine resolution, which minimizes TDC quantization noise and allows for a high bandwidth in the PLL. This reduces low frequency resistance in the digitally-controlled oscillator and jitter due to magnetic coupling effects.

Figure 4:
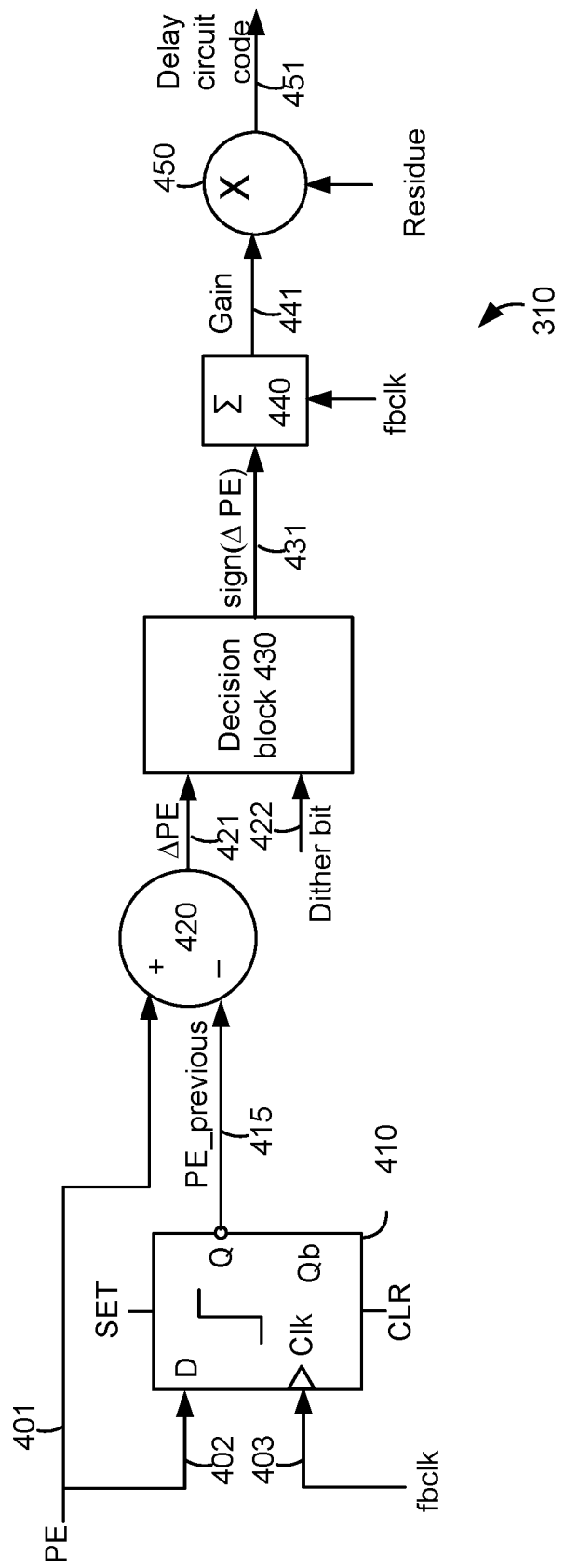
FIG. 4 depicts an example implementation of the adaptive gain circuit 310 of FIG. 3.

FIG. 4 depicts an example implementation of the adaptive gain circuit 310 of FIG. 3. The current phase error PE is provided on a path 401 to a positive input of a subtraction circuit 420. PE is also provided on a path 402 to the D input of a D type or inverting flip flop 410. Fbvclk is provided to the clock input (Clk) of the flip flop. The flip flop also includes inputs for setting (SET) and clearing (CLR).

The output of the flip flop at a node Q is the previous value of PE, e.g., PE_previous. This value is provided on a path 415 to the negative input of the subtraction circuit. The subtraction circuit outputs a value ΔPE=PE−PE_previous. PE represents the phase error for a current or nth fbclk cycle, while PE_previous represents the phase error for a most recent previous or n−1st fbclk cycle, in one approach. Additionally, PE could be the phase error for the last fbclk cycle of the division cycle and PE_previous could be the phase error for the last fbclk cycle of the division cycle. In one approach, PE and PE_previous are both sampled once per division cycle from the phase error signal on path 123.

ΔPE is provided on a path 421 to a decision block 430, which also receives the dither bit on a path 422. When the dither bit changes, the decision block outputs the sign or polarity of ΔPE. At other times, the decision block outputs zero. Generally, the dither bit indicates to the adaptive gain circuit when to evaluate the samples of the phase error signal. In this approach, the adaptive gain circuit uses the polarity of ΔPE to determine how to adjust the gain. Sign (ΔPE) is provided on a path 431 to a summation circuit 440, which also receives fbclk. The summation circuit can adjust the gain based on a summation of successive values of sign (ΔPE). See also FIG. 13C. In one approach, the gain is set to an initial value based on testing or calculations and is then incremented by one unit for each new value of sign (ΔPE), e.g., once per division cycle. The gain can be increased or decreased when ΔPE is positive or negative, respectively. A multiplier 450 provides the product of gain and the residue on a path 451 as a delay circuit code.

Optionally, the magnitude of ΔPE as well as the sign could be used to adjust the gain. For example, a relatively large adjustment to the gain can be made when the magnitude of ΔPE is relatively large. However, this would add complications and it is believed that small, incremental adjustments are sufficient to quickly converge to a steady state condition.

As an alternative, the adaptive gain circuit can use a single sampled value of PE instead of ΔPE to adjust its gain. For example, it may use sign(PE) for one fbclk cycle in a division cycle, such as the last fbclk cycle, which will likely have the largest PE in the division cycle. This provides the greatest resolution in evaluating the phase delay.

Generally, the phase detector will quantize the phase delay based on its resolution. For example, the phase detector may have a resolution of 10 psec., so that a phase difference will be quantized into one of the ranges of 0-10, 11-20, 21-30 psec. and so forth. The phase detector will assign a different code value to each range to identify the range. The code value is then provided to the loop filter and the adaptive gain circuit for use as described herein. In another option, the code is a single bit which indicates the sign of the PE or ΔPE.

FIG. 5A depicts an example implementation of the delay circuit 330 of FIG. 3. The delay circuit receives divclk and outputs a delay version of divclk as fbclk. One example of a delay circuit is an analog delay line, which is a network of electrical components connected in cascade, where each individual element creates a time difference between its input and output. In this example, a series of capacitors and buffers are provides in stages, e.g., four stages 510, 520, 530 and 540. Each stage can include a bank of capacitors and inductors connected as indicated in FIG. 5B.

FIG. 5B depicts an example implementation of the stage 510 of the delay circuit of FIG. 5A. The inductors L are connected in series and the capacitors C are connected through junctions between the inductors to ground. The delay line can be tapped at many different points to provide corresponding different delays. The delay line advantageously can have a very linear response such that the delay changes uniformly with each change in a code word provided by the adaptive gain circuit to the delay circuit.

In an example implementation, each stage has 128 capacitors and each capacitor adds a delay of 0.5 psec. The tuning range of the delay circuit is therefore 128×4×0.5=256 psec.

The linearity and step size of the delay line are relevant. To cancel out the phase modulations on divclk, the delay ramp generated by the delay line should be as linear as possible with steps that are small enough. Any non-linearity in the delay line, measured as INL, would appear as phase error modulations at the phase detector input and eventually cause jitter. Additionally, a large step size would cause a coarse staircase pattern, which is another form of INL, instead of a smooth ramp.

The proposed delay line provides both excellent linearity and small steps. Each stage in the delay line can comprise a CMOS buffer which is loaded by a switchable capacitance bank. Since the signal slope is proportional to I/C, the delay is proportional to C/I. A fixed step size and good linearity can therefore be obtained. To further improve linearity, the capacitor banks can be fully thermometer coded (unary coded) where the code is distributed evenly among the stages to reduce sensitivity to device mismatch between the stages. The capacitors are based on device capacitance for area efficiency.

Note that if the oscillator has multiple phases, it is possible to design a shorter delay line that would wrap-around every time the feedback clock gets aligned to the next phase. The adaptive gain module should adjust the gain per alignment to each of the oscillator's phases.

FIG. 6A depicts example signals for fbclk, divclk and inclk in the PLL of FIG. 3, showing a minimized phase difference between the signals fbclk and inclk within a division cycle, when the gain of the adaptive gain circuit 310 is optimal. The solid-line clock signal 600 is fbclk and the dotted-line clock signal 200 is divclk from FIG. 2A. Fbclk is delayed relative to divclk by the delay circuit. The clock signal 205 is inclk as in FIG. 2A. The clock signals extend over one division cycle as depicted by the arrow 201. The division includes a time period (arrow 202) in which the divider divides outclk by N and a time period (arrow 203) in which the divider divides outclk by N+1.

The cycles 610-619 have a duration or period of T4-T4$i$, respectively, and the cycles 220-229 have a duration of T3. After the first cycle 610, which has a duration T4, the consecutive cycles 611-619 of fbclk are delayed by progressively larger durations relative to divclk so that they align in phase with the cycles 221-229, respectively, of inclk. An additional fbclk cycle 630 with a period T4 and an additional inclk cycle 240 with a period T3 are the first cycles in a next division cycle.

FIG. 6B depicts a delay of divclk versus divclk cycle number, showing a progressively increasing delay for successive clock cycles of divclk, consistent with FIG. 6A. By progressively increasing the delays imposed upon divclk by the delay circuit, the resulting cycles of fbclk are delayed in such a way that they align precisely with each cycle of inclk, thereby avoiding issues such as noise spurs and jitter. This result is achieved when the gain of the adaptive gain circuit is at an optimal, steady state level. In this example, the delay is zero for cycle 1 of fbclk and increases linearly with each consecutive cycle until a peak delay is provided for the tenth (last) cycle, which is cycle 619. The delay then decreases back to zero for the first cycle of the next division cycle, which is cycle 630.

In each division cycle, the fractional divider is to divide the output clock by an integer N for x cycles (e.g., nine) of the divided version of the output clock, where x is an integer, and to divide the output clock by an integer N+1 for one cycle of the divided version of the output clock. In each division cycle, the progressively larger delays applied to the divided version of the output clock are to align edges (rising or falling) of the divided version of the output clock with edges (rising or falling, respectively) of the input clock for the x cycles of the divided version of the output clock. Further, in each division cycle, the delay circuit is to apply no delay to a first cycle of the divided version of the output clock, followed by progressively larger delays to x (e.g., nine) cycles of the divided version of the output clock.

Figure 7:
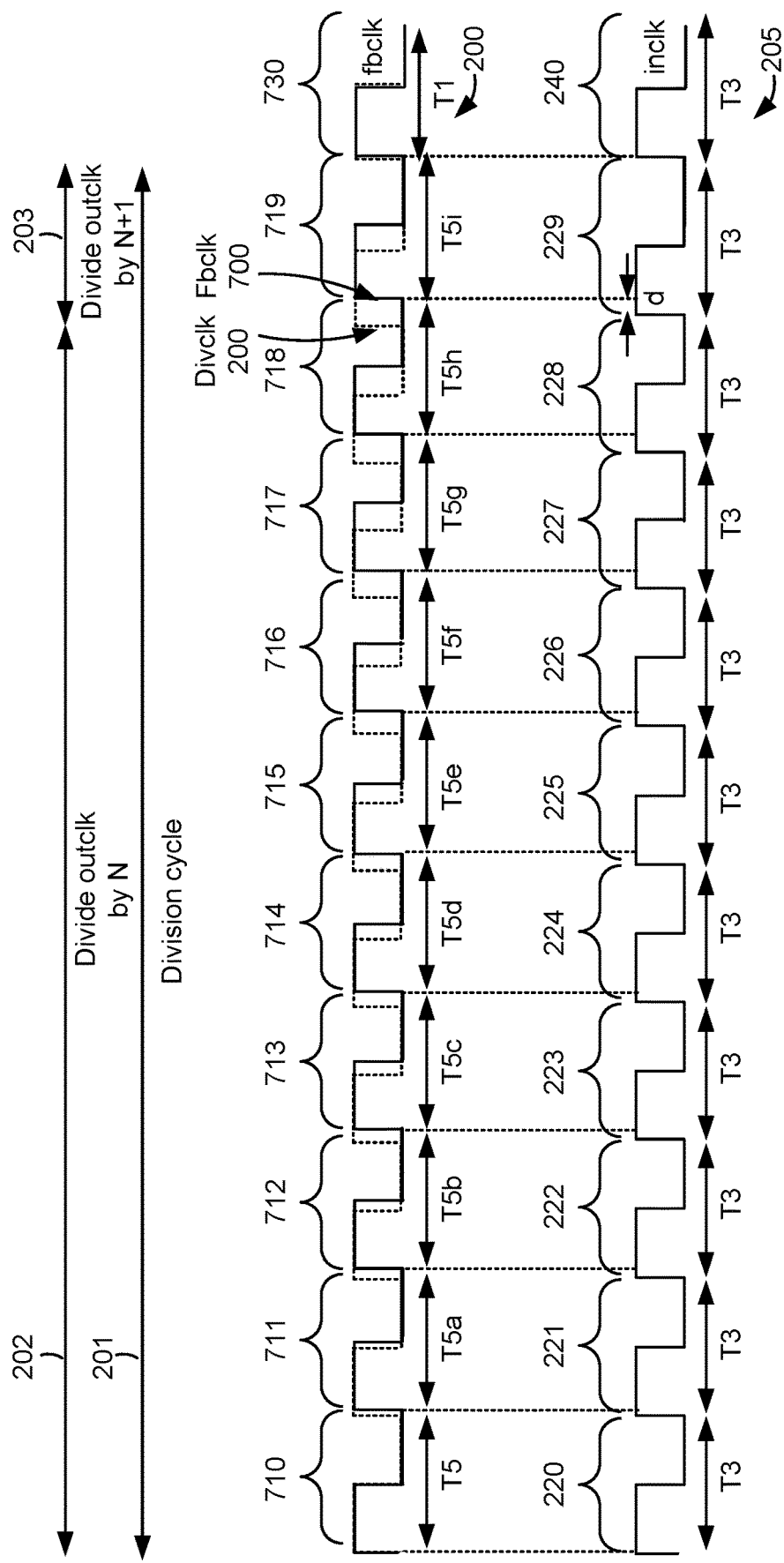
FIG. 7 depicts example signals for fbclk, divclk and inclk in the PLL of FIG. 3, showing an increasing phase difference between the signals fbclk and inclk within a division cycle, when the gain of the adaptive gain circuit 310 of FIG. 3 is too high.

FIG. 7 depicts example signals for fbclk, divclk and inclk in the PLL of FIG. 3, showing an increasing phase difference between the signals fbclk and inclk within a division cycle, when the gain of the adaptive gain circuit 310 of FIG. 3 is too high. The clock signal 700 is fbclk and the clock signal 200 is divclk. The clock signal 205 is inclk as in FIG. 2A. The cycles 710-719 have a duration or period of T5-T5$i$, respectively. An additional fbclk cycle 730 with a period T5 and an additional inclk cycle 240 with a period T3 are the first cycles in a next division cycle. When the gain is too high, the cycles of fbclk will be delayed too much such that fbclk begins to lag inclk by progressively larger amounts in the division cycle. In this example, the delay is zero for cycle 1 of fbclk and increases linearly with each consecutive cycle until a peak delay is provided for the tenth cycle, which is cycle 719. The delay then decreases back to zero for the first cycle of the next division cycle, which is cycle 730. The peak phase difference between fbclk and inclk is depicted by "d" for the cycles 719 and 229.

An analogous result is obtained when the gain is too low. In this case, the cycles of fbclk will be delayed too little such that fbclk begins to lead inclk by progressively larger amounts in the division cycle.

Figure 8:
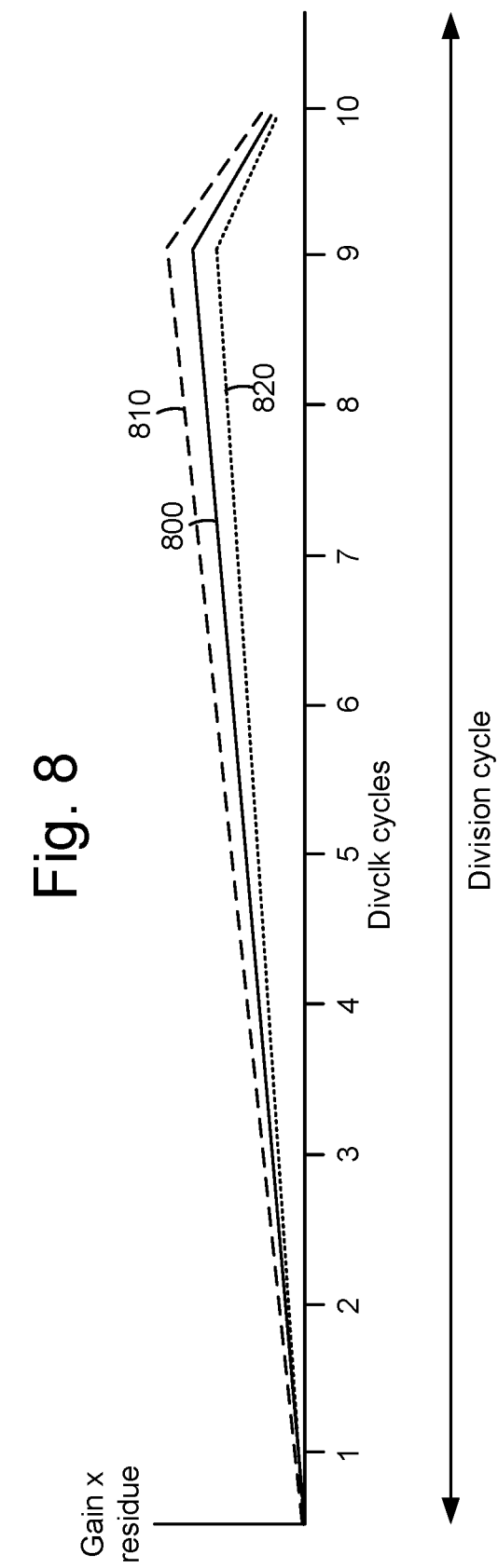
FIG. 8 depicts a plot of gain×residue versus divclk cycle number, for different values of gain, for use with the adaptive gain circuit 310 of FIG. 3.

FIG. 8 depicts a plot of gain×residue versus divclk cycle number, for different values of gain, for use with the adaptive gain circuit 310 of FIG. 3. A plot 800 represents an optimal gain, while a plot 810 is represents a gain which is too high and a plot 820 represents a gain which is too low. The product gain×residue may be provided as a control signal from the adaptive gain circuit to the delay circuit to set the delay for each cycle of divclk. The residue may have the value of a counter which counts up from zero by equal increments, for example. For instance, the residue may be 0, 0.1, 0.2 and so forth for cycle 1, 2 and 3 and so forth of divclk. The gain may be a fixed value throughout a single division cycle, so that gain×residue increases as the residue increases. The residue may increase linearly, e.g., by equal increments, so that gain×residue, representing the requested delay, also increases linearly with each divclk cycle.

Figure 9:
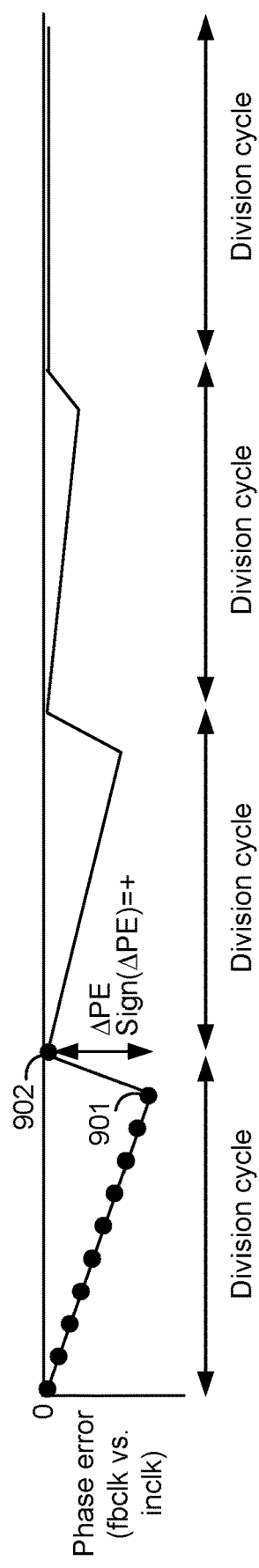
FIG. 9 depicts a progression of a phase error between divclk and inclk in the PLL of FIG. 3, where the gain of the adaptive gain circuit 310 of FIG. 3 is initially too low.

FIG. 9 depicts a progression of a phase error between divclk and inclk in the PLL of FIG. 3, where the gain of the adaptive gain circuit 310 of FIG. 3 is initially too low. Generally, the gain can be set at an initial level which may not be optimal. The PLL can then converge to an optimal gain. In this example, the gain is too low so that the phase error is positive, indicating that fbclk lags inclk. As gain× residue increases and then returns to zero in each division cycle, the phase error also increases in magnitude and then returns to zero or close to zero. Due to the adaptive adjusting of the gain in each successive division cycle, the gain moves closer to an optimal level, and the peak phase error becomes smaller (less negative) in each successive division cycle, as depicted. The gain is shown reaching an optimal level in which the phase error remains at zero in only four division cycles, as a simplification.

The PE is determined by the phase detector at example time points identified by dark circles. In the first division cycle, for example, the PE is obtained at ten points including a tenth point 901. In the second division cycle, the PE is obtained at ten points including a first point 902. ΔPE is equal to the PE at point 902 minus the PE at point 901. The sign of ΔPE in this example is positive (+), since zero minus a negative number is a positive number. This informs the adaptive gain circuit that the gain (and therefore the delay)

should be decreased. Once it is sufficiently decreased, the phase error converges toward zero.

In this example, the delay circuit essentially creates an opposite pattern to the phase error pattern of FIG. 2B to cancel out large modulations of PE. To do so, the code to the delay circuit ramps and slowly decreases the delay of the delay circuit over a division cycle. Then, when the feedback divider ratio changes, e.g., at the end of a division cycle, the code returns to zero and brings back the delay line to its minimum delay. The code can be based on the residue generated by the modulator and the gain of the adaptive delay circuit.

Specifically, when the divisor changes from N to N+1, the decision block 430 of FIG. 4 checks the change in the phase detector output, $\Delta$PE. If the rate is too high, the delay circuit is overcompensating such that $\Delta$PE is negative. Similarly, if the rate is too low, the delay circuit is undercompensating such that $\Delta$PE is positive. Using the sign of $\Delta$PE as an indication, the adaptive gain circuit either increments or decrements the gain to a point where the rate is optimal and fully cancels the phase error modulations.

Figure 10:
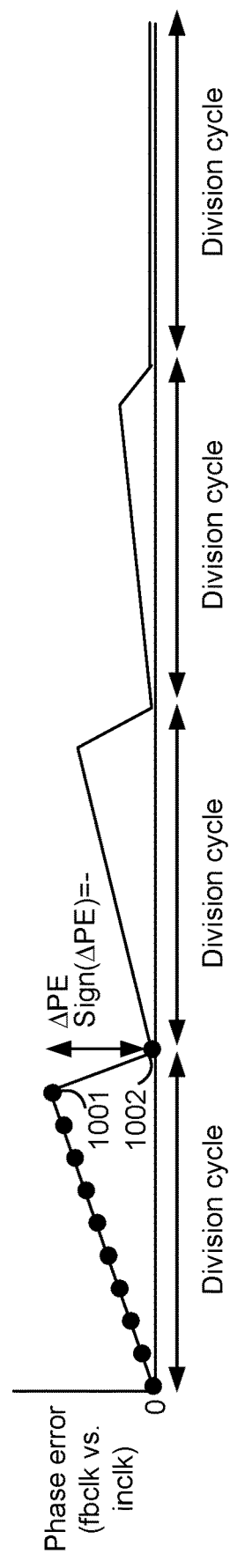
FIG. 10 depicts a progression of a phase error between divclk and inclk in the PLL of FIG. 3, where the gain of the adaptive gain circuit 310 of FIG. 3 is initially too high.

FIG. 10 depicts a progression of a phase error between divclk and inclk in the PLL of FIG. 3, where the gain of the adaptive gain circuit 310 of FIG. 3 is initially too high. In this example, the gain is too high so that the phase error is negative, indicating that fbclk leads inclk. As gain×residue increases and then returns to zero in each division cycle, the phase error also increases in magnitude and then returns to zero or close to zero. Due to the adaptive adjusting of the gain in each successive division cycle, the gain moves closer to an optimal level, and the peak phase error becomes smaller (less positive) in each successive division cycle, as depicted. The gain is shown reaching an optimal level in which the phase error remains at zero in only four division cycles, as a simplification.

As before, the PE is determined at example time points identified by dark circles. In the first division cycle, for example, the PE is obtained at ten points including a tenth point 1001. In the second division cycle, the PE is obtained at ten points including a first point 1002. $\Delta$PE is equal to the PE at point 1002 minus the PE at point 1001. The sign of $\Delta$PE in this example is negative (−), since zero minus a positive number is a negative number. This informs the adaptive gain circuit that the gain (and therefore the delay) should be increased. Once it is sufficiently increased, the phase error converges toward zero.

Figure 11:
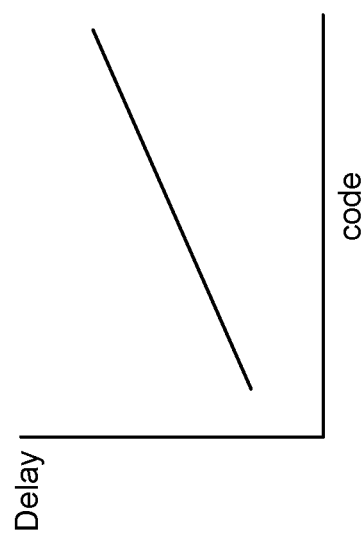
FIG. 11 depicts a plot of a delay of divclk versus a code output from the adaptive gain circuit to the delay circuit 330 of FIG. 3, showing a linear behavior.

FIG. 11 depicts a plot of a delay of divclk versus a code output from the adaptive gain circuit to the delay circuit 330 of FIG. 3, showing a linear behavior. The code can represent the product of gain×residue and indicates the amount of delay which should be imposed on a given clock cycle of divclk. As mentioned, the change in the delay may be linear with the change in the code. For example, an eight bit code allows for 256 different delay levels, and each change of one bit in the code represent a change of $\Delta t$ of the delay.

Figure 12:
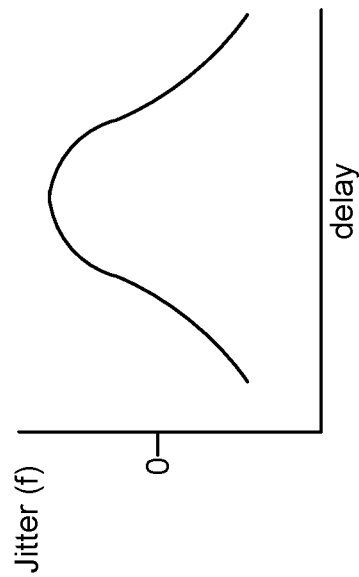
FIG. 12 depicts a plot of jitter in outclk versus the delay of divclk in the PLL 300 of FIG. 3.

FIG. 12 depicts a plot of jitter in outclk versus the delay of divclk in the PLL 300 of FIG. 3. The jitter represents a change in the frequency of outclk relative to a desired level. The frequency is lower than the desired level at low and high levels of delay and greater than the desired level at midrange levels of delay. Results indicate that the jitter is kept in a tightly controlled range throughout the range of possible delays.

Note that the step size is slightly higher at the lower codes and gets smaller with higher codes, causing this bell-shaped INL. This is a very subtle effect which causes less than 1 psec. INL. It is possible to add a single capacitor as offset on the second half of the range to slightly reduce the INL.

The time axes are aligned in FIG. 13A-13C.

FIG. 13A depicts an example plot of phase error (PE) versus time in the PLL 300 of FIG. 3. When the PLL is first operated, PE can vary in a relatively large range before settling in a narrow range.

FIG. 13B depicts an example plot of the delay of divclk versus time in the PLL 300 of FIG. 3, consistent with FIG. 13A. This represents the largest delay in each divclk cycle. The delay oscillates uniformly between a minimum level (min.) and a maximum level (max.)

FIG. 13C depicts an example plot of the gain of the adaptive gain circuit of FIG. 3, consistent with FIGS. 13A and 13B. As mentioned, the adaptive gain can vary in discrete steps with each division cycle. The adaptive gain may begin at an initial level and gradually converge to a narrow range, as depicted.

The result of FIG. 13A-13C were obtained from a simulation which models the adaptive cycle delay line. Over time, the adaptive algorithm converges the gain to the optimal point and the phase error becomes minimal.

Figure 14:
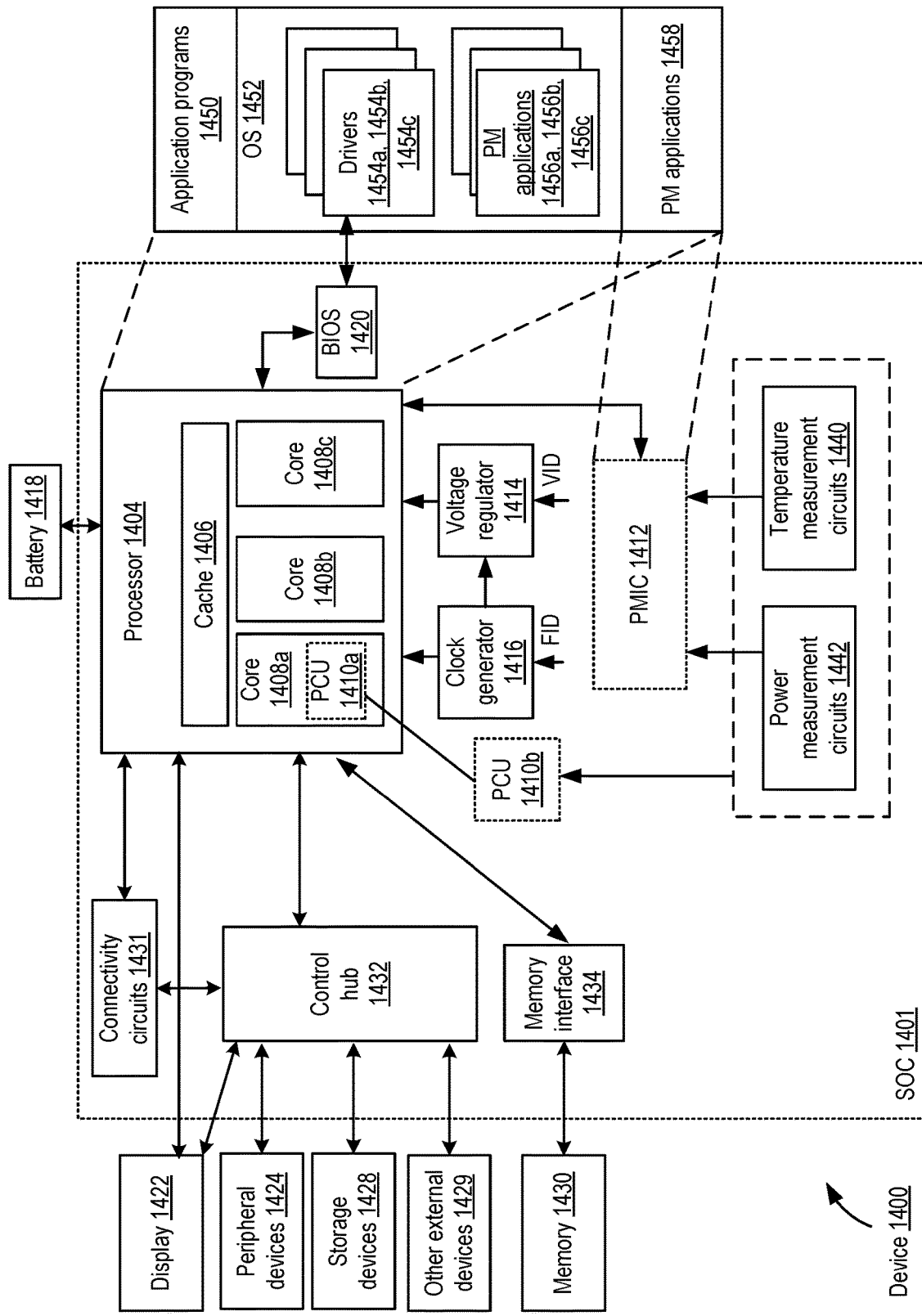
FIG. 14 illustrates a smart device or a computer system or a System-on-Chip (SoC) with apparatus and/or software in accordance with some embodiments.

FIG. 14 illustrates a smart device or a computer system or a System-on-Chip (SoC) with apparatus and/or software in accordance with some embodiments. In some embodiments, device 1400 represents a computing device such as a computing tablet, a mobile phone or smartphone, a laptop, a desktop, an Internet-of-Things (IOT) device, a server, a wearable device, a set-top box, a wireless-enabled e-reader, or the like. It will be understood that certain components are shown generally, and not all components of such a device are shown in device 1400.

In an example, the device 1400 comprises a SoC (System-on-Chip) 1401. An example boundary of the SoC 1401 is illustrated using dotted lines, with some example components being illustrated to be included within the SoC.

In some embodiments, device 1400 includes a processor 1404. Processor 1404 can include one or more physical devices, such as microprocessors, application processors, microcontrollers, programmable logic devices, or processing cores. The processing operations performed by processor 1404 can include the execution of an operating platform or operating system on which applications and/or device functions are executed. The processing operations can include operations related to I/O (input/output) with a human user or with other devices, operations related to power management, operations related to connecting computing device 1400 to another device. The processing operations may also include operations related to audio I/O and/or display I/O.

In some embodiments, the processor 1404 includes multiple processing cores such as the example cores 1408*a*, 1408*b*, 1408*c*. The cores may be implemented on a single integrated circuit (IC) chip which may include one or more shared and/or private caches, buses or interconnections, graphics and/or memory controllers, or other components.

In some embodiments, the processor 1404 includes a cache 1406. Sections of the cache 1406 may be dedicated to individual cores or one or more sections of the cache 1406 may be shared among two or more cores. The cache 1406 may be split in different levels, e.g., level 1 (L1) cache, level 2 (L2) cache and level 3 (L3) cache.

In some embodiments, the processor 1404 may include a fetch unit to fetch instructions from any storage devices such as the memory 1430, for execution by the processor 1404.

In some embodiments, the device 1400 comprises connectivity circuits 1431 such as hardware devices (e.g., wireless and/or wired connectors and communication hardware) and/or software components (e.g., drivers, protocol stacks), e.g., to enable the device 1400 to communicate with external devices. The device 1400 may be separate from the external devices, such as other computing devices, wireless access points or base stations, etc.

In some embodiments, the device 1400 comprises a control hub 1432, which represents hardware devices and/or software components related to interaction with one or more I/O devices. For example, the processor 1404 may communicate with a display 1422, peripheral devices 1424, storage devices 1428, and external devices 1429 via the control hub 1432. The control hub 1432 may be a chip set, a Platform Control Hub (PCH), or the like.

The control hub 1432 may connect additional devices to the device 1400, e.g., through which a user might interact with the system. For example, connectivity circuits 1431 may be coupled to the control hub 1432, e.g., in addition to, or instead of, being coupled directly to the processor 1404.

In some embodiments, the device 1400 comprises a memory 1430 coupled to the processor 1404 via a memory interface 1434. The memory 1430 includes memory devices for storing information.

In some embodiments, the device 1400 comprises temperature measurement circuits 1440, e.g., for measuring temperature of various components of device 1400. In an example, temperature measurement circuits 1440 may be embedded, or coupled or attached to various components, whose temperature are to be measured and monitored. For example, temperature measurement circuits 1440 may measure temperature of (or within) one or more of cores 1408*a*, 1408*b*, 1408*c*, voltage regulator 1414, memory 1430, a mother-board of SoC 1401, and/or any appropriate component of device 1400.

In some embodiments, the device 1400 comprises power measurement circuits 1442, e.g., for measuring power consumed by one or more components of the device 1400.

In some embodiments, the device 1400 comprises one or more voltage regulator circuits 1414, generally referred to as voltage regulators (VRs). VR 1414 generates signals at appropriate voltage levels, which may be supplied to operate components of the device 1400. Merely as an example, VR 1414 is illustrated to be supplying signals to processor 1404 of device 1400. In some embodiments, VR 1414 receives one or more Voltage Identification (VID) signals, and generates the voltage signal at an appropriate level, based on the VID signals. Various type of VRs may be utilized for the VR 1414. For example, VR 1414 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 1410*a/b* and/or PMIC 1412. In some embodiments, each core has a network of distributed LDOs to provide efficient control for power management. The LDOs can be digital, analog, or a combination of digital or analog LDOs. In some embodiments, VR 1414 includes current tracking apparatus to measure current through power supply rail(s).

In some embodiments, the device 1400 comprises a clock generator 1416 which generates clock signals at appropriate frequency levels for any appropriate components of the device 1400. Merely as an example, clock generator 1416 is illustrated to be supplying clock signals to the processor 1404 and the VR 1414. In some embodiments, clock generator 1416 receives one or more Frequency Identification (FID) signals, and generates the clock signals at an appropriate frequency, based on the FID signals. The output clock signal, outclk, is one example of a clock signal.

In some embodiments, the device 1400 comprises a battery 1418 supplying power to various components of the device 1400 such as the processor 1404.

In some embodiments, the device 1400 comprises Power Control Units (PCUs) 1410*a* and 1410*b*. In an example, some sections of a PCU may be implemented by one or more processing cores 1408*a*-1408*c*, and these sections of the PCU are symbolically illustrated using a dotted box and labelled PCU 1410*a*. In an example, some other sections of PCU may be implemented outside the processing cores, and these sections of PCU are symbolically illustrated using a dotted box and labelled as PCU 1410*b*. The PCU may implement various power management operations for device 1400.

In some embodiments, the device 1400 comprises a Power Management Integrated Circuit (PMIC) 1412, e.g., to implement various power management operations for the device 1400.

In an example, the device 1400 comprises the PCU and/or PMIC.

Various power management operations of device 1400 may be performed by the PCU and/or by PMIC 1412.

The clock generator 1416 can comprise a phase locked loop (PLL), frequency locked loop (FLL), or any suitable clock source. In some embodiments, each core of processor 1404 has its own clock source. A PLL can be provided such as depicted in FIG. 3.

Also illustrated is an example software stack of device 1400 (although not all elements of the software stack are illustrated). The processor 1404 may execute application programs 1450, Operating System 1452, one or more Power Management (PM) specific application programs (e.g., generically referred to as PM applications 1458). PM applications 1458 may also be executed by the PCU and/or PMIC. OS 1452 may also include one or more PM applications 1456*a*, 1456*b*, 1456*c*. The OS 1452 may also include various drivers 1454*a*, 1454*b*, 1454*c*, some of which may be specific for power management purposes. In some embodiments, the device 1400 may further comprise a Basic Input/output System (BIOS) 1420. BIOS 1420 may communicate with OS 1452 via one or more of the drivers.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a phase detector to compare a phase of an input clock to a phase of a feedback clock and output a corresponding phase error signal; a loop filter coupled to the phase detector; an oscillator coupled to the loop filter, the loop filter to set a frequency of an output clock at an output terminal of the oscillator based on the phase error signal; and a feedback path between the output terminal of the oscillator and an input terminal of the phase detector, the feedback path comprising a fractional divider and a delay circuit, the fractional divider to provide a divided version of the output clock, and the delay circuit, to provide the feedback clock, is to apply progressively larger delays to the divided version of the output clock in each division cycle of successive division cycles.

Example 2 includes the apparatus of example 1, wherein in each division cycle, the fractional divider is to divide the output clock by an integer N for x cycles of the divided version of the output clock, where x is an integer, and to divide the output clock by an integer N+1 for one cycle of the divided version of the output clock.

Example 3 includes the apparatus of example 1 or 2, wherein in each division cycle, the progressively larger delays applied to the divided version of the output clock are to align edges of the divided version of the output clock with edges of the input clock for the x cycles of the divided version of the output clock.

Example 4 includes the apparatus of any of examples 1 to 3, wherein in each division cycle, the delay circuit is to apply no delay to a first cycle of the divided version of the output clock, followed by progressively larger delays to x cycles of the divided version of the output clock.

Example 5 includes the apparatus of any of examples 1 to 4, wherein the delay increases linearly with each consecutive clock cycle of the x cycles of the divided version of the output clock.

Example 6 includes the apparatus of any of examples 1 to 5, and further comprises an adaptive gain circuit coupled to the delay circuit, the adaptive gain circuit is to adjust a gain based on samples of the phase error signal and to set a delay of the delay circuit based on the gain.

Example 7 includes the apparatus of example 6, wherein the adaptive gain circuit is to obtain the samples of the phase error signal once every division cycle.

Example 8 includes the apparatus of example 6 or 7, wherein the adaptive gain circuit is to adjust the gain based on a difference in phase error for two samples of the phase error signal.

Example 9 includes the apparatus of any one of examples 6 to 8, and further comprises a modulator circuit coupled to the adaptive gain circuit, wherein the modulator circuit is to provide a dither bit to the adaptive gain circuit, the dither bit to indicate to the adaptive gain circuit when to evaluate the samples of the phase error signal.

Example 10 includes the apparatus of any one of examples 6 to 9, wherein the adaptive gain circuit is to adjust the gain based on a polarity of the samples of the phase error signal.

Example 11 includes the apparatus of example 10, wherein when the polarity of the phase error signal indicates a phase of the feedback clock lags a phase of the input clock, the adaptive gain circuit is to decrease the gain.

Example 12 includes the apparatus of any one of examples 6 to 11, and further comprises a modulator circuit coupled to the adaptive gain circuit, wherein the modulator circuit is to provide a residue to the adaptive gain circuit, and the residue counts up in value for each cycle of the divided version of the output clock after a first cycle of the divided version of the output clock.

Example 13 includes the apparatus of example 12, wherein the adaptive gain circuit is to set a delay of the delay circuit based on a product of the residue and the gain.

Example 14 includes an apparatus, comprising: a fractional divider in a feedback path of a phase-locked loop (PLL); a delay circuit in the feedback path of the PLL, the delay circuit is coupled to the fractional divider; and an adaptive gain circuit coupled to the delay circuit, the fractional divider is to provide a divided version of an output clock of the PLL to the delay circuit, and the delay circuit is to provide a feedback clock of the feedback path as a time-delayed version of the divided version of the output clock, wherein different cycles of the divided version of the output clock are delayed by different amounts at the delay circuit based on signals received from the adaptive gain circuit.

Example 15 includes the apparatus of example 14, and further comprises a modulator coupled to the adaptive gain circuit and to the feedback path, the modulator is to provide a counter to the adaptive gain circuit with each cycle of the divided version of the output clock, and the adaptive gain circuit is to set a delay of the delay circuit based on the counter and the gain.

Example 16 includes the apparatus of example 14 or 15, wherein the adaptive gain circuit is to periodically adjust the gain based on a phase error between the feedback clock and an input clock of the PLL.

Example 17 includes the apparatus of any one of examples 14 to 16, wherein the delay circuit is to delay the divided version of the output clock by progressively increasing amounts in each division cycle of successive division cycles of the divided version of the output clock.

Example 18 includes an apparatus, comprising: a modulator coupled to a feedback path of a phase-locked loop (PLL) and to a fractional divider of the PLL, wherein the modulator is to provide a dither bit to the fractional divider, the dither bit to indicate to the fractional divider when to divide an output clock of the PLL by an integer N and when to divide the output clock by an integer N+1; and an adaptive gain circuit coupled to the modulator, wherein the modulator is to provide a counter to the adaptive gain circuit, and the adaptive gain circuit is to set a variable delay for a divided version of the output clock provided by the fractional divider, based on the counter received from the modulator and a gain of the adaptive gain circuit.

Example 19 includes the apparatus of example 18, wherein the fractional divider, to provide the divided version of an output clock of the PLL, is to divide the output clock by the integer N for x cycles, where x is an integer, and to divide the output clock by the integer N+1 for one cycle; and the modulator is to increment the counter for x cycles of the divided version of the output clock.

Example 20 includes the apparatus of example 18 or 19, wherein the adaptive gain circuit is to adjust the gain based on a phase error between the feedback clock and an input clock of the PLL one time for x+1 cycles of the divided version of the output clock.

Example 21 includes the apparatus of any one of examples 18 to 20, wherein the adaptive gain circuit is to set the variable delay for the divided version of the output clock based on a product of the counter and the gain.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a phase detector to compare a phase of an input clock to a phase of a feedback clock and output a corresponding phase error signal;
a loop filter coupled to the phase detector;
an oscillator coupled to the loop filter, the loop filter to set a frequency of an output clock at an output terminal of the oscillator based on the phase error signal; and
a feedback path between the output terminal of the oscillator and an input terminal of the phase detector, the feedback path comprising a fractional divider and a delay circuit, the fractional divider to provide a divided version of the output clock, and the delay circuit, to provide the feedback clock, is to apply progressively larger delays to the divided version of the output clock in each division cycle of successive division cycles.

2. The apparatus of claim 1, wherein:
in each division cycle, the fractional divider is to divide the output clock by an integer N for x cycles of the divided version of the output clock, where x is an integer, and to divide the output clock by an integer N+1 for one cycle of the divided version of the output clock.

3. The apparatus of claim 2, wherein:
in each division cycle, the progressively larger delays applied to the divided version of the output clock are to align edges of the divided version of the output clock with edges of the input clock for the x cycles of the divided version of the output clock.

4. The apparatus of claim 2, wherein:
in each division cycle, the delay circuit is to apply no delay to a first cycle of the divided version of the output clock, followed by progressively larger delays to x cycles of the divided version of the output clock.

5. The apparatus of claim 1, wherein:
the delay increases linearly with each consecutive clock cycle of x cycles of the divided version of the output clock.

6. The apparatus of claim 1, further comprising:
an adaptive gain circuit coupled to the delay circuit, the adaptive gain circuit is to adjust a gain based on samples of the phase error signal and to set a delay of the delay circuit based on the gain.

7. The apparatus of claim 6, wherein:
the adaptive gain circuit is to obtain the samples of the phase error signal once every division cycle.

8. The apparatus of claim 6, wherein:
the adaptive gain circuit is to adjust the gain based on a difference in phase error for two samples of the phase error signal.

9. The apparatus of claim 6, further comprising:
a modulator circuit coupled to the adaptive gain circuit, wherein the modulator circuit is to provide a dither bit to the adaptive gain circuit, the dither bit to indicate to the adaptive gain circuit when to evaluate the samples of the phase error signal.

10. The apparatus of claim 6, wherein:
the adaptive gain circuit is to adjust the gain based on a polarity of the samples of the phase error signal.

11. The apparatus of claim 10, wherein:
when the polarity of the phase error signal indicates a phase of the feedback clock lags a phase of the input clock, the adaptive gain circuit is to decrease the gain.

12. The apparatus of claim 6, further comprising:
a modulator circuit coupled to the adaptive gain circuit, wherein the modulator circuit is to provide a residue to the adaptive gain circuit, and the residue counts up in value for each cycle of the divided version of the output clock after a first cycle of the divided version of the output clock.

13. The apparatus of claim 12, wherein:
the adaptive gain circuit is to set a delay of the delay circuit based on a product of the residue and the gain.

14. An apparatus, comprising:
a fractional divider in a feedback path of a phase-locked loop (PLL);
a delay circuit in the feedback path of the PLL, the delay circuit is coupled to the fractional divider; and
an adaptive gain circuit coupled to the delay circuit, the fractional divider is to provide a divided version of an output clock of the PLL to the delay circuit, and the delay circuit is to provide a feedback clock of the feedback path as a time-delayed version of the divided version of the output clock, wherein different cycles of the divided version of the output clock are delayed by different amounts at the delay circuit based on signals received from the adaptive gain circuit.

15. The apparatus of claim 14, further comprising:
a modulator coupled to the adaptive gain circuit and to the feedback path, the modulator is to provide a counter to the adaptive gain circuit with each cycle of the divided version of the output clock, and the adaptive gain circuit is to set a delay of the delay circuit based on the counter and the gain.

16. The apparatus of claim 14, wherein:
the adaptive gain circuit is to periodically adjust the gain based on a phase error between the feedback clock and an input clock of the PLL.

17. The apparatus of claim 14, wherein:
the delay circuit is to delay the divided version of the output clock by progressively increasing amounts in each division cycle of successive division cycles of the divided version of the output clock.

18. An apparatus, comprising:
a modulator coupled to a feedback path of a phase-locked loop (PLL) and to a fractional divider of the PLL, wherein the modulator is to provide a dither bit to the fractional divider, the dither bit to indicate to the fractional divider when to divide an output clock of the PLL by an integer N and when to divide the output clock by an integer N+1; and
an adaptive gain circuit coupled to the modulator, wherein the modulator is to provide a counter to the adaptive gain circuit, and the adaptive gain circuit is to set a variable delay for a divided version of the output clock provided by the fractional divider, based on the counter received from the modulator and a gain of the adaptive gain circuit.

19. The apparatus of claim 18, wherein:
the adaptive gain circuit is to set the variable delay for the divided version of the output clock based on a product of the counter and the gain.

20. The apparatus of claim 18, wherein:
the fractional divider, to provide the divided version of an output clock of the PLL, is to divide the output clock by the integer N for x cycles, where x is an integer, and to divide the output clock by the integer N+1 for one cycle; and
the modulator is to increment the counter for x cycles of the divided version of the output clock.

21. The apparatus of claim 20, wherein:
the adaptive gain circuit is to adjust the gain based on a phase error between the feedback clock and an input clock of the PLL one time for x+1 cycles of the divided version of the output clock.

\* \* \* \* \*